United States Patent

McCurdy et al.

Patent Number: 5,773,086
Date of Patent: Jun. 30, 1998

[54] METHOD OF COATING FLAT GLASS WITH INDIUM OXIDE

[75] Inventors: Richard J. McCurdy; David A. Strickler, both of Toledo, Ohio; Kevin D. Sanderson, Omskirk, United Kingdom

[73] Assignees: Libbey-Owens-Ford Co., Toledo, Ohio; Pilkington PLC, St. Helens, England

[21] Appl. No.: 694,435

[22] Filed: Aug. 13, 1996

[51] Int. Cl.[6] ............................. C23C 16/40; B05D 5/06
[52] U.S. Cl. .................... 427/255.3; 437/255.2; 437/255.1; 437/255; 437/166; 437/109; 437/314; 65/60.52
[58] Field of Search .............................. 427/255.3, 255.2, 427/255.1, 255, 166, 109, 314; 65/60.5, 60.52

[56] References Cited

U.S. PATENT DOCUMENTS

| | | |
|---|---|---|
| 4,286,009 | 8/1981 | Griest . |
| 4,828,880 | 5/1989 | Jenkins et al. ........................ 427/167 |
| 5,090,985 | 2/1992 | Soubeynand et al. ................ 65/60.52 |
| 5,580,364 | 12/1996 | Goodman et al. ..................... 65/60.2 |

FOREIGN PATENT DOCUMENTS

| | | |
|---|---|---|
| 0027403 | 2/1984 | European Pat. Off. . |
| 0192009 | 8/1986 | European Pat. Off. . |
| 0489621 | 6/1992 | European Pat. Off. . |
| 0503382 | 9/1992 | European Pat. Off. . |

OTHER PUBLICATIONS

Maruyama et al, J. Appl. Phys. 70(7), Oct. 1991, pp. 3848–3851.
Ozasa et al, J. Vac. Soc. Technol. A(12(1), Jan./Feb. 1994, pp. 120–124.
Maruyama et al, J. Appl. Phys. 71(6), Mar. 1992, pp. 2915–2917.
Mayer, Thin Solid Films, 221 (1992), pp. 166–182.
Maruyama et al, Jpn. J. Appl. Phys., Part 2, 28(7), 1989, L1096–L1097.

*Primary Examiner*—Roy V. King
*Attorney, Agent, or Firm*—Marshall & Melhorn

[57] ABSTRACT

The invention relates to the coating of flat glass with indium oxide. Indium oxide coatings, optionally doped, for example with tin, are produced in high yield by utilising a chemical vapour deposition process in which a gaseous mixture of a dialkylindium compound and a source of oxygen is directed on to the hot glass surface (The dialkylindium may also be used without pre-mixing but with separate supply of the oxygen source to the glass surface). The processes of the invention are especially suitable for application of a doped indium oxide coating to a continuous ribbon of glass on the production line on which the glass is formed, for use, for example, in architectural glazing applications utilising the low emissivity of the coating.

10 Claims, No Drawings

METHOD OF COATING FLAT GLASS WITH INDIUM OXIDE

BACKGROUND OF THE INVENTION

The invention relates to pyrolytic coating of glass with indium oxide and to glass coated in accordance with the method.

Indium oxide coatings, especially doped (for example with fluorine or tin) indium oxide coatings, on glass are known to have a high visible light transmission and good electrical conductivity. Tin doped indium oxide coatings deposited by reactive sputtering are widely used as heatable coatings, for example on aircraft windscreens, and it has also been proposed to use doped indium oxide coatings as low emissivity (infra red reflecting) coatings on architectural glass to control heat loss through glazing.

While it is known to deposit tin doped indium oxide coatings on glass by reactive sputtering, it would be desirable to have a commercially applicable method of depositing such coatings pyrolytically on hot glass at atmospheric pressure. Not only would the need to operate at low pressure be avoided, but such a method could, if capable of deposition at a high rate, be applied to hot glass on the glass production line so that the coating process could be operated continuously rather than batchwise.

U.S. Pat. No. 4,286,009 relates to a composite coating for the absorber surface of a solar heat collector. Each of the two layers of the composite coating is of metal oxides selected from the group consisting essentially of oxides of tin, antimony, indium and iron. An indium oxide coating, doped with tin oxide, is deposited by spraying a solution of indium chloride ($InCl_3$) and stannic chloride ($SnCl_4$) in ethyl acetate onto hot glass at 650° C.

European patent EP 0 027 403B1 relates to a method of depositing an electrically conducting film of tin oxide or indium oxide on a hot glass surface by contacting the hot surface with a vapour of a tin or indium compound; it is particularly concerned with the use of a gaseous organic fluorocompound, heated and brought into contact with a catalyst, and then brought into contact with the glass with the vapour of the indium or tin compound to introduce fluorine dopant into the indium oxide or tin oxide coating formed. In general, the coating is desirably carried out at a glass temperature of above 400° C., and in the specific Example, a gaseous mixture containing dimethyltin dichloride, $(CH_3)_2 SnCl_2$, and dichlorodifluoromethane, $(Cl_2F_2)$, is applied to hot glass at 550° C. to deposit a fluorine doped tin oxide coating on the glass.

European patent application EP 0 192 009A2 relates to the formation of indium oxide coatings on hot glass, and is particularly concerned with processes in which an indium oxide precursor is applied to a hot float glass ribbon on its exit from the float bath, for example at a glass temperature of 600° C. It refers to the use of compounds of indium, in particular acetylacetonates, in solution, but indicates that these compounds are unsatisfactory for use in powder form. It proposes the use, either in solution or in powder form, of indium formate, $In(HCOO)_3$.

European patent application EP 0 489 621A1 relates to a process for forming a coating of aluminium oxide combined with another oxide which may be zinc oxide, tin oxide, titanium oxide or indium oxide, on a glass support. The coating is intended to form an intermediate coating (as an anti-iridescence coating) between a glass substrate and a low emissivity and/or electrically conductive overlayer. The coating is formed by pyrolysis of metal compounds in powder form on the hot glass surface, and it is proposed to use, as a source of indium oxide, indium acetylacetonate or indium formate in powder form.

European patent application EP 0 503 382A1 relates to a chemical vapour deposition method of forming a doped indium oxide coating on a glass substrate. In the method described, separate laminar flows of sources of indium and of an oxidising gas, temporarily isolated by an intermediate flow of inert gas, are passed, with a heated substrate (which may be of glass) into a chemical reaction chamber. The source of indium is capable of adsorbing onto the surface of the heated substrate, and the intermediate flow of inert gas controls the rate at which oxidising gas can pass through to react with the adsorbed layer to form indium oxide. Examples of compounds which may be used in vapour form as sources of indium are trimethylindium and trimethylindium ethyletherate.

Despite all efforts to prepare commercial doped indium oxide coatings by deposition on hot glass at atmospheric pressure during the glass production process, there is still no commercial production of indium oxide in this way.

It has now been discovered that, for such an "on-line" method to be commercially acceptable, it is highly advantageous that a chemical vapour deposition process be used, and that a premixed vapour containing both a source of indium and a source of oxygen be applied to the hot glass since this enables high yields of coating, based on the amount of indium precursor supplied, to be achieved.

According to one aspect of the present invention, there is provided a process for applying an indium oxide coating to flat glass comprising directing a gaseous mixture of an indium compound and a source of oxygen onto a hot glass surface whereby the indium compound decomposes with formation of an indium oxide coating on the hot glass surface.

It has further been found that dialkyl indium compounds are particularly suitable for use as precursors for indium oxide in processes for applying indium oxide coatings to hot glass by chemical vapour deposition.

According to a further aspect of the present invention, there is provided a process for applying an indium oxide coating to flat glass comprising directing a dialkyl indium compound in vapour form on to a hot glass surface in the presence of a source of oxygen whereby the indium compound decomposes with formation of an indium oxide coating on the hot glass surface. The dialkyl indium compound is preferably, although not necessarily, premixed with the source of oxygen before being directed on to the hot glass surface.

When the indium compound is admixed with a source of oxygen before being directed onto the glass it is preferred that the mixture be directed onto the hot glass surface under laminar flow conditions.

The processes of the present invention (especially processes involving application of a preformed gaseous mixture of an indium precursor compound and a source of oxygen under laminar flow conditions) enable high yields of indium oxide coating, in relation to the amount of indium precursor supplied, to be achieved. Since the cost of indium is high, this is an important advantage.

According to a preferred embodiment of the invention, the process provides, under steady state operating conditions, incorporation of at least 30% and, in especially preferred embodiments, over 35% of the indium supplied as precursor in the indium oxide coating formed.

To achieve good electrical conductivity and/or low emissivity (i.e. high infra-red reflection), it is preferable that the indium oxide be doped. We prefer to use tin as the dopant, because the high solubility of tin oxide in indium oxide enables a high concentration of charge carriers to be achieved. Thus it is preferred to use a tin compound in vapour form in conjunction with the indium compound whereby a tin doped indium oxide coating is formed on the hot glass surface. Preferably, the tin compound is admixed with the indium compound and a gaseous mixture of the tin and indium compounds directed onto the hot glass surface.

However, other dopants may also be used. For example, a source of fluorine may be incorporated in the gas directed onto the hot glass surface to form a fluorine doped indium oxide coating. A separate source of fluorine, for example hydrogen fluoride or a halogen substituted alkane in which the halogen includes fluorine, may be included in the reactant gas containing the indium compound, or a fluorine containing indium compound, for example, indium trifluoroacetylacetonate, may be used as the source of both indium and fluorine.

The coating may be applied to a hot glass ribbon during the glass manufacturing process. If the coating is applied to float glass in the float bath, a high rate of deposition may be achieved (because of the high temperature of the glass) and the glass remains sufficiently hot to apply one or more overlayers by a pyrolytic process (preferably chemical vapour deposition) without reheating the glass. The indium oxide coating may be formed directly on a hot glass surface or on top of one or more previously formed coating layers, for example a layer of silicon oxycarbide previously deposited on the glass to suppress iridescence which would otherwise result from the indium oxide coating, and/or to protect the coating from the deleterious effects of migration of alkali metal ions from the glass into the coating.

The invention is illustrated, but not limited, by the following Examples in which all parts and percentages are by weight unless otherwise stated, and gas volumes and flows are measured at 1 atmosphere pressure and ambient temperature (typically 15°–20° C.). The nitrogen and oxygen gases were used as supplied by BOC, the nitrogen being "white spot" grade or "boil off". In Examples in which the coating is applied to a moving ribbon of glass, the gas volumes and flows (and any other quantities of reagents used) are quoted per metre width of glass coated. The conversion efficiencies quoted are for indium, and are calculated by dividing the rate of incorporation of indium in the indium oxide coating by the rate of supply of indium, and expressing the result as a percentage. The amount of indium in the film (and hence its rate of incorporation) is calculated from the dimensions of the indium oxide coating, assuming the coating consists wholly of indium oxide having a density of 7.18 grams per cubic centimetre.

EXAMPLES 1–7

In this series of Examples, pre-formed gaseous mixtures of indium precursor compound and oxygen were directed onto samples (100 mm×200 mm) of 4 mm clear float glass mounted on an electrically heated graphite block in a glass reactor tube. The exposed major surface of the glass had been precoated with an underlayer of silicon oxycarbide of refractive index about 1.7, applied in accordance with EP 0 275 662B.

In Examples 1, 4 and 5, the dimethylindium acetylacetonate (2,4 pentanedione) was vapourised by a technique referred to as reverse bubbling. The solid indium compound in particulate form was placed in a bubbler, and nitrogen gas passed into the bubbler above the solid material. The nitrogen gas diffused through the particulate solid and passed out of the bubbler through a tube whose open end was immersed below the surface of the particulate solid. In each case, the indium compound was maintained at a temperature of 80° C. during vapourisation. The rate of flow of nitrogen through the bubbler in each case is shown in the accompanying Table 1.

In Example 2, dimethylindium acetylacetonate was dissolved in n-propylacetate at a concentration of about 10% and the solution injected at a rate in the range 1 to 5 ml a minute into a flow of nitrogen gas (3 litres/minute) at 200° C.

In Examples 3, 6 and 7, indium tristetramethylheptanedione (melting point about 180° C.) was maintained in a bubbler at 200° C. and nitrogen bubbled through the liquid indium compound at a rate of 0.2 litres/minute.

In each case, the nitrogen gas charged with indium compound vapour was mixed with additional flows of nitrogen and oxygen (supplied at the flow rates shown in Table 1) and the gaseous mixture directed over the hot glass surface under laminar flow conditions at a total flow rate of around 5/6 litres per minute. The graphite block was heated to a temperature 625° C., with the glass temperature about 10–15° C. lower.

In each of Examples 4 to 7, a tin dopant was mixed with the vapourised indium compound and the gaseous mixture directed onto the hot glass surface.

In Example 4, a solution of dimethyltindichloride (0.25 gram) in n-butyl acetate was injected into the gaseous mixture used before supply to the heated glass at a rate of 0.75 ml per minute.

In Example 5, nitrogen was bubbled through dimethyltindiacetate at 30° C. at the rate of 1 litre per minute. In Example 6, nitrogen was passed over dimethyltindichloride at a temperature in the range 30–35° C. at a rate of 0.8 litres per minute. In Example 7, nitrogen was passed over dimethyltindiacetate at 30–35° C. at a rate of 0.5 litres per minute. In each case, the nitrogen gas carrying the tin dopant was mixed with the indium containing gases prior to delivery to the hot glass surface.

In each case, the deposition was continued for the time shown in the Table. After deposition, the reactor was allowed to cool (under a flow of $N_2$) and, after cooling, the glass removed and examined. In each case an indium oxide coating had been formed. The thickness and resistivity of the coating, the haze (determined in accordance with ASTM D100361, 1988, using the D65 Illuminant option) and, for Examples 2, 6 and 7, the emissivity (in accordance with BS6993 part 1) of the coated glass were measured. The results are reported in Table 2. In some cases, there were considerable variations in thickness of the indium oxide over the coated surface; the values of resistivity, haze and emissivity were those measured where the coating had the thickness quoted in Table 2.

In general, the Examples show the suitability of the indium precursors used for the deposition of indium oxide coatings on glass, their compatibility with precursors used to provide tin doping, and the possibility of producing conductive, low emissivity coatings (especially when a dopant is used).

The results show a substantially higher growth rate in Example 2 than the other Examples. This is presumably because the method of vapourisation used for the indium compound (liquid injection) enabled an increase mass of precursor to be vapourised resulting in an increased concentration of indium in the coating gas directed on to the glass.

The haze values are generally at commercially acceptable levels, although somewhat higher in Example 5 than in the other Examples. The increased haze in Example 5 is not well understood. As expected, the sheet resistance and emissivity are substantially lower for the coatings prepared using a tin dopant, and compare favourably with values recorded for fluorine doped tin oxide coatings of corresponding thickness. This is believed to be due to the high carrier concentration and ionic mobility exhibited by the doped coatings. Measurements of ionic mobility on the coating of Examples 4, 6 and 7 gave values of 43.15, 45.57 and 50.42 cm$^2$ V$^{-1}$ sec$^{-1}$, while corresponding values for carrier concentration were 7.38, 6.19 and 3.42×10$^{26}$ M$^{-3}$.

TABLE 1

| Example | Indium Compound | N$_2$ flow through vapouriser (liters/minute) | Additional N$_2$ flow (liters/minute) | Additional O$_2$ flow (liters/minute) | Tin dopant | Deposition time (minutes) |
|---|---|---|---|---|---|---|
| 1 | Me$_2$In (acac)[1] | 1 | 4.5 | 0.6 | — | 6 |
| 2 | Me$_2$In (acac) | — | — | 3.8 | — | |
| 3 | In (thd)$_3$[2] | 0.2 | 4.5 | 0.6 | — | 11 |
| 4 | Me$_2$In (acac) | 1 | 4.5 | 0.6 | DMT[3] | 6 |
| 5 | Me$_2$In (acac) | 1 | 4.7 | 0.6 | DMTDA[4] | 11 |
| 6 | In (thd)$_3$ | 0.2 | 4.7 | 0.6 | DMT | |
| 7 | In (thd)$_3$ | 0.2 | 4.7 | 0.6 | DMTDA | |

[1]dimethylindium acetylacetonate
[2]indium tristetramethylheptanedionate
[3]dimethyl tin dichloride
[4]dimethyl tin diacetate

TABLE 2

| Example | Coating thickness (nm) | Growth rate (nm per second) | Sheet resistance (ohms per square) | Haze % | Emissivity |
|---|---|---|---|---|---|
| 1 | 280 | 0.8 | 73.4 | <0.2 | |
| 2 | | 10–15 | 60–150 | <0.2 | 0.5 |
| 3 | 86 | 0.5 | 185 | <0.2 | |
| 4 | 278 | 0.8 | 6.0 | 0.3 | |
| 5 | 524 | 0.8 | 4.0 | 0.7 | |
| 6 | 190 | 0.3–5 | 9.8 | 0.4 | 0.13 |
| 7 | 154 | 0.4–0.5 | 18.3 | <0.2 | 0.24 |

EXAMPLES 8–20

The following Examples 8 to 20 each involve application of an indium oxide coating to a hot ribbon of float glass having thickness in the range 1.1 to 4 mm moving at a lehr speed in the range 150 to 330 -metres/hour during the glass manufacturing process.

In each case, a pre-formed gaseous mixture including indium precursor compound and oxygen was directed over the surface of the float glass bath under laminar flow conditions as generally described in UK patent GB 1 507 996.

In each of Examples 8 to 16, 19 and 20, the coater was located towards the cooler end of the float bath where the glass temperature was around 625° C. In Examples 17 and 18, the coater was located over the glass ribbon at a position in the lehr where the glass temperature was about 500° C.

In Example 8, dimethylindium acetylacetonate was vapourised by bubbling nitrogen through the indium compound above its melting point (i.e. at 148° C.) at a rate varying in the range 2 to 12 litres per hour. Propyl acetate was injected into the nitrogen gas charged with indium compound at a rate of 180 grams per minute to assess the tolerance of the system to the presence of the propyl acetate (used as a solvent for the indium compound in Example 9). In Example 9, dimethylindium acetylacetonate dissolved in propyl acetate at a concentration of about 10% and the solution injected at a rate of 200 grams per minute into a nitrogen carrier gas flowing at a rate of 45 litres per minute and heated to about 160° C.

In Example 10, indium tristetramethylheptanedionate was maintained in a bubbler at 220–250° C. and nitrogen bubbled through the liquid indium compound at a rate varying in the range 2 to 8 litres per minute. Butyl acetate was injected onto the nitrogen gas charged with indium compound at a rate of 100 ml per minute.

In each of Examples 8, 9 and 10, the nitrogen gas charged with the vapour of the indium compound was mixed with additional flows of nitrogen carrier gas and oxygen (Examples 8 and 10) or oxygen (Example 9) as indicated in Table 3 and the gaseous mixture passed to the coater.

In Examples 11 to 20, indium compounds (dimethylindium chloride, dimethylindium hexafluoroacetylacetonate or dimethyl indium acetylacetonate in solution in ethylacetate) were vapourised using direct liquid injection systems such as the system available from Advanced Technology Materials of Boston, USA, under the trade mark SPARTA 1505A or the system described in U.S. Pat. No. 5,090,985. These systems employ a pumping system which supplied precursor solution at a controlled rate to an evaporator, where it is vapourised, normally with the addition of a carrier gas at a constant rate; further carrier gas may be added after evaporation to achieved the desired concentration and flow characteristics. The particular indium compound, rate of delivery, carrier gas and total carrier gas flow rate used in each of Examples 11 to 20 is shown in Table 3. The carrier gas containing the vapour of the indium compound was mixed with a flow of oxygen containing, in some cases, water vapour and/or hydrogen chloride (see Table 3), and the gaseous mixture directed on to the hot glass through the coater.

In each of Examples 11 to 15, 19 and 20, a tin dopant was added to the gas mixture. Nitrogen was bubbled through liquid n-butyl tin-trichloride at 95° C. or tetramethyl tin at 30° C. at the rate shown in the table and the resultant gas mixed with the oxygen gas supplied to the coater.

TABLE 3

| Example | Indium Compound | Solution Used | Rate of supply of solution to liquid injection system (ml/minute) | Carrier gas | Carrier gas[7] flow rate (liters/minute) | Oxygen flow rate (liters/minute) | Tin dopant | Rate of gas supply through tin dopant (liters/minute) |
|---|---|---|---|---|---|---|---|---|
| 8 | $Me_2In$ (acac) | | | $N_2$ | 45 | 25 | | |
| 9 | $M_2In$ (acac) | | | | | 38 | | |
| 10 | $In(thd)_3$ | | | $N_2$ | 55 | 7 | | |
| 11 | $Me_2InCl$[5] | 19 mole % in ethyl acetate | 30 | He | 110 | 10 +3 water vapour +1.1 hydrogen chloride | Butyl tin trichloride | 5 |
| 12 | $Me_2InCl$ | 19 mole % in ethyl acetate | 30 | He | 110 | 8.5 +4.5 water vapour +0.8 hydrogen chloride | Butyl tin trichloride | 4 |
| 13 | $Me_2InCl$ | 19 mole % in ethyl acetate | 30 | He | 110 | 8.5 +1.5 water vapour +1.1 hydrogen chloride | Butyl tin trichloride | 8 |
| 14 | $Me_2InCl$ | 19 mole % in ethyl acetate | 30 | He | 120 | 10 +2.9 water vapour +1.7 hydrogen chloride | Tetramethyl tin | 3 |
| 15 | $Me_2InCl$ | 19 mole % in ethyl acetate | 30 | He | 110 | 10 +3 water vapour +1 hydrogen chloride | Butyl tin trichloride | 10 |
| 16 | $Me_2In(hfac)$[6] | 3 mole % in ethyl acetate | 150 | He | 72 | 20 | | |
| 17 | $Me_2In(acac)$ | 6 mole % in ethyl acetate | 100 | $N_2$ | 35 | 25 | | |
| 18 | $Me_2In(hfac)$[6] | 6 mole % in ethyl acetate | 100 | $N_2$ | 35 | 25 | | |
| 19 | $Me_2In(hfac)$[6] | 30 weight % in ethyl acetate | 60 | He | 100 | 12 +3 water vapour | Butyl tin trichloride | 15 |
| 20 | $Me_2In(acac)$? | 20 weight % in ethyl acetate | 25 | He | 90 | 10 | Tetramethyl tin | 4 |

[5] dimethylindium chloride
[6] dimethylindiumhexafluoroacetylacetonate
[7] In Examples 8 and 10, this is the volume of $N_2$ additional carrier gas added to the nitrogen charged with indium compound.

TABLE 4

| Example | Coating thickness (nm) | Growth rate (nm per second) | Sheet resistance (ohms per square) | Conversion efficiency % |
|---|---|---|---|---|
| 8 | 89 | 30–40 | 5000 | |
| 9 | 64 | 20–30 | 800 | |
| 10 | 38 | 10–15 | non-conductive | |
| 11 | 154 | 16 | 119 | |
| 12 | 257 | 27 | 50 | 30 |
| 13 | 141 | 15 | 185 | 16 |
| 14 | 240 | 25 | 31.2 | 28 |
| 15 | 316 | 38 | 9.8 | 42 |
| 16 | 132 | 44 | 300 | 52 |
| 19 | 129 | 18 | 118 | 53 |
| 20 | 150 | 17 | 900 | 54 |

In each case, an indium oxide coating was formed on the glass. In all cases except for Examples 17 and 18 the thickness and resistivity of the coating were measured, and growth rate of the coating calculated and conversion efficiency of indium in the precursor calculated as indicated above. It will be appreciated that the calculation of conversion efficiency gives only an approximate (but nevertheless sufficiently indicative to be useful) value, since no allowance is made for the presence of tin dopant in the coating, or for any variation in the density of the coating from the value of 7.18 referred to above.

The high growth rates and conversion efficiencies achieved, especially with the dialkylindium precursors, indicate the suitability of the process for commercial application, while the measured sheet resistances of the coatings indicate electronic properties which will result in low emissivity i.e. high infra red reflectivity.

EXAMPLES 21–23

These Examples each involve application of a tin doped indium oxide coating to a ribbon of float glass about 2.5 mm thick moving at a lehr speed of 155 metres/hour. In each case, a pre-formed gaseous mixture of dimethyl indium chloride, oxygen, water vapour and hydrogen chloride in helium carrier gas is directed over the glass under laminar flow conditions using a dual flow coater in which the coating gas is caused to flow in separate upstream and downstream flows from a central gas supply duct oriented transverse to the direction of glass advance (similar to the coating described and illustrated with reference to FIG. 3 of International Patent Application WO 96/11802).

The coater was located over the glass ribbon at a position in the float bath where the glass temperature was about 625° C.

A solution of 19 mole % dimethylindium chloride in ethyl acetate was vapourised at a rate of 30 millilitres per minute into helium carrier gas flowing at a rate of 110 litres per minute using a direct liquid injection system as used in Examples 11 to 20. The carrier gas containing the vapour of the indium compound was mixed with a mixed flow of (a) 10 litres per minute oxygen, containing 17.4 litres per minute water vapour (6 litres per minute in Example 23) and 1.1 litres per minute hydrogen chloride (8 litres per minute in Example 23) and (b) n-butyl tin trichloride produced by bubbling nitrogen through liquid n-butyl tin trichloride at 95° C. at 0.6 litres per minute (15 litres per minute in Example 22). In each case a thin film of tin doped indium oxide was deposited on the glass; the thickness of the films, the film growth rates and their sheet resistances, together with approximate indium conversion efficiencies achieved, are shown in Table 5.

TABLE 5

| Example | Coating thickness nm | Growth Rate nm/second | Sheet resistance ohms per square | Conversion efficiency % |
| --- | --- | --- | --- | --- |
| 21 | 170 | 22 | 67 | 37 |
| 22 | 195 | 25 | 110 | 42 |
| 23 | 130 | 17 | 110 | 28 |

EXAMPLE 24

In this Example, a preformed gaseous mixture of indium trifluoroacetylacetonate and oxygen was used to form a fluorine doped indium oxide coating on a thin (0.070 inches, approx 2 mm) thick float glass sample in a static furnace in the laboratory.

The glass substrate was positioned on a resistively heated nickel block in the static furnace and maintained at a temperature of 1200° F. (650° C.). A rectangular channel was positioned above and around the glass substrate. The channel had a top surface that was maintained at a temperature of about 500° F. (260° C.) by a cooling coil with a conventional oil based heat transfer medium. The rectangular channel served as the coating apparatus to introduce the coating precursor gas near the surface of the glass substrate. The precursor gas was introduced between the top surface of the rectangular channel and the glass substrate.

A fluorine doped indium oxide coating was deposited onto the substrate by using indium trifluoroacetylacetonate as the precursor. The indium trifluoroacetylacetonate was vapourized by bubbling helium through the liquid indium compound at a rate of 300 cubic centimetres per minute and a temperature of 366° F. (185° C.).

The helium gas charged with indium compound was mixed with additional flows of helium (2.5 litres/minute) and oxygen (4.5 litres/minute) and the gaseous mixture (total flow rate approximately 7.3 litres/minute) directed over the hot glass surface. After about two minutes, the indium and oxygen flows were discontinued, the furnace allowed to cool and the glass removed and examined. A fluorine doped indium oxide coating had been formed at a growth rate of 3.1 nm per second, and had a sheet resistance of 27 ohms per square.

What is claimed is:

1. A process for applying an indium oxide coating to flat glass comprises directing a dialkyl indium compound in vapour form onto a hot glass surface in the presence of a source of oxygen whereby the indium compound decomposes with formation of said indium oxide coating on the hot glass surface.

2. A process as claimed in claim 1, which comprises forming a mixture of the dialkylindium compound with a source of oxygen and directing the mixture in vapour form onto the hot glass surface.

3. A process as claimed in claim 1, wherein the indium compound is admixed with a source of oxygen before being directed onto the glass and the mixture directed over the hot glass surface under laminar flow conditions.

4. A process as claimed in claim 1, wherein a tin compound is used in conjunction with the indium compound whereby a tin doped indium oxide coating is formed on the hot glass surface.

5. A process as claimed in claim 4, wherein the tin compound is admixed with the indium compound and a gaseous mixture containing the tin and indium compounds is directed onto the hot glass surface.

6. A process as claimed in claim 1, wherein a source of fluorine is included in the gas directed onto the hot gas surface whereby a fluorine doped indium oxide coating is formed on the hot glass surface.

7. A process as claimed in claim 6, wherein a fluorine-containing indium compound is used as the source of both indium and fluorine.

8. A process as claimed in claim 1, wherein at least 30% of the indium supplied as precursor is incorporated in the indium oxide coating formed.

9. A process as claimed in claim 1, wherein the indium compound is vaporized by direct liquid injection.

10. A process as claimed in claim 1, wherein the hot glass surface is the surface of a hot glass ribbon.

* * * * *